(12) United States Patent
Rowell et al.

(10) Patent No.: US 11,789,068 B2
(45) Date of Patent: Oct. 17, 2023

(54) ANTENNA ASSEMBLY, TEST SYSTEM AND METHOD OF ESTABLISHING A TEST SYSTEM

(71) Applicant: Rohde & Schwarz GmbH & Co. KG, Munich (DE)

(72) Inventors: Corbett Rowell, Munich (DE); Daniel Markert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 106 days.

(21) Appl. No.: 17/365,726

(22) Filed: Jul. 1, 2021

(65) Prior Publication Data

US 2022/0034961 A1 Feb. 3, 2022

(30) Foreign Application Priority Data

Jul. 29, 2020 (EP) .................................... 20188379

(51) Int. Cl.
| | | |
|---|---|---|
| *G01R 31/302* | (2006.01) | |
| *H01P 1/161* | (2006.01) | |
| *H01Q 13/02* | (2006.01) | |
| *H01Q 19/10* | (2006.01) | |

(52) U.S. Cl.
CPC .......... *G01R 31/3025* (2013.01); *H01P 1/161* (2013.01); *H01Q 13/0275* (2013.01); *H01Q 19/10* (2013.01)

(58) Field of Classification Search
CPC ............ G01R 31/3025; G01R 29/0878; G01R 29/105; G01R 29/0821; H01P 1/161; H01Q 13/0275; H01Q 19/10; H01Q 13/0258; H01Q 1/36; H01Q 1/50; H01Q 13/02; H01Q 15/242; H01Q 15/244

USPC ...................................................... 324/754.31
See application file for complete search history.

(56) References Cited

U.S. PATENT DOCUMENTS

| | | | | |
|---|---|---|---|---|
| 3,639,863 | A * | 2/1972 | Monaghan | H01Q 3/34 333/182 |
| 4,543,579 | A * | 9/1985 | Teshirogi | H01Q 25/001 342/365 |
| 6,087,908 | A * | 7/2000 | Haller | H01P 1/161 343/756 |
| 2009/0302971 | A1* | 12/2009 | Rosenberg | H01P 1/161 333/137 |
| 2014/0057576 | A1* | 2/2014 | Monte | H01Q 1/125 343/762 |
| 2020/0177289 | A1* | 6/2020 | Maruo | G01R 29/105 |

\* cited by examiner

*Primary Examiner* — Jermele M Hollington
*Assistant Examiner* — Robert P Alejnikov, Jr.
(74) *Attorney, Agent, or Firm* — CHRISTENSEN O'CONNOR JOHNSON KINDNESS PLLC

(57) ABSTRACT

Embodiments of the present disclosure provide an antenna assembly for a test system. The antenna assembly includes a feedthrough part, two waveguide inputs, a single waveguide output as well as a multiplexing part that is interconnected between the two waveguide inputs and the single waveguide output. The multiplexing part is integrated within the feedthrough part at least partially. Moreover, embodiments of the present disclosure provide a test system and a method of establishing a test system for testing a device under test.

19 Claims, 3 Drawing Sheets

ANTENNA ASSEMBLY, TEST SYSTEM AND METHOD OF ESTABLISHING A TEST SYSTEM

TECHNICAL FIELD

Embodiments of the present disclosure relate to an antenna assembly for a test system. Further, embodiments of the present disclosure relate to a test system for testing a device under test as well as a method of establishing a test system for testing a device under test.

BACKGROUND

In the state of the art, it is known to test several different devices under test (DUTs) by means of a test system that comprises a test chamber in which the respective device under test is placed for testing purposes. These test systems relate to so-called compact antenna test ranges (CATR) since far-field characteristics of the device under test can be tested even though the test chamber has small dimensions. The test system comprises at least one feed antenna that is used for testing the device under test, wherein the feed antenna receives test signals that are converted into radio waves by the antenna, which are used to test the device under test. Typically, the respective test signals are generated externally by means of a signal generator. Thus, it is required to forward the respective test signals generated to the feed antenna that is located within the test chamber. For this purpose, a feedthrough is provided in the housing of the test chamber. The feedthrough is connected with the antenna by cables that are located within the test chamber, particularly at a bottom or in a shielded manner.

The respective feed antennas may be established as dual-polarized antennas that are enabled to process horizontally polarized signals as well as vertically polarized signals, namely orthogonally polarized signals. Hence, a so-called orthomode transducer (OMT) is provided that is connected with the feed antenna. The orthomode transducer is a waveguide component that is also called polarization duplexer since it serves to combine or to separate two orthogonally polarized signals, which may be provided by respective signal paths. Accordingly, the orthomode transducer is typically interconnected between the feedthrough and the antenna.

However, the test systems known in the state of the art, particularly the arrangement of the individual components, are not suitable for very small chambers, particularly in relation to the size of the quite zone used for testing the device under test.

SUMMARY

Accordingly, there is need for a test system that is suitable for small test chambers, for example with respect to the size of the quite zone.

Embodiments of the present disclosure provide an antenna assembly for a test system. In an embodiment, the antenna assembly comprises a feedthrough part, two waveguide inputs, a single waveguide output as well as a multiplexing part that is interconnected between the two waveguide inputs and the single waveguide output. In some embodiments, the multiplexing part is integrated within the feedthrough part at least partially.

The main idea relates to at least partially integrating the multiplexing part within the feedthrough part that provides the interface for interconnecting a feed antenna of the test system with the respective cables or lines that provide the test signals generated by an external signal generator. Accordingly, it is not necessary to connect the multiplexing part with the feedthrough via cables. Since the multiplexing part is directly integrated into the feedthrough part, no gaps between the multiplexing part and the feedthrough part occur. Put differently, the space required between the multiplexing part and the feedthrough part is minimized, thereby ensuring that relatively small test chambers can be used for testing the device under test, for example compared to the size of the quite zone established for testing purposes.

In general, the multiplexing part can be used for combining different signals, for example differently polarized signals such as orthogonally polarized signals. The different signals may be forwarded to the antenna assembly by the respective waveguide inputs that can be connected with cables or lines originating from the signal generator.

Further, the multiplexing part can be used for separating different signal portions of a signal processed, for example differently polarized signal portions such as orthogonally polarized signal portions. The different signal portions may be forwarded to an externally located signal analyzer by the respective waveguide inputs. Hence, the waveguide inputs are used to forward signals to the signal analyzer.

Generally, the waveguide inputs as well as the single waveguide output may be used in a bidirectional manner, which means that they can be used in both transmission directions. In some embodiments, this depends on the operation mode of the antenna assembly. When signals are transmitted to the device under test, the test signals are forwarded to the waveguide inputs that process the signals in order to output radio waves to the device under test via the single waveguide output. When signals are transmitted by the device under test, the single waveguide output receives the signals which are processed and forwarded to the waveguide inputs.

Moreover, the antenna assembly ensures low path loss due to the integration of the multiplexing part into the feedthrough part. Furthermore, the entire test system is less complex compared to the arrangement known in the state of the art since the antenna assembly according to the present disclosure provides several functions in a combined manner.

In addition, an easy feed switching, namely a manual one, can be ensured by the antenna assembly due to the fact that two waveguide inputs are provided at an external side such that the two waveguide inputs are associated with a side of the feedthrough part that can be accessed from the outside when the antenna assembly is installed, namely in the mounted state.

An aspect of the disclosure provides that the multiplexing part is integrated within the feedthrough by milling and/or welding. The multiplexing part may be provided at least partially by material of the feedthrough part. For instance, a respective structure is milled within the material of the feedthrough part such that the structure is used for multiplexing. In an alternative, the multiplexing part and the feedthrough part are separately manufactured parts that are integrated with each other by welding. Nevertheless, the feedthrough part contributes to the multiplexing part at the respective interface and vice versa.

In an example, the multiplexing part and the feedthrough part are formed in one piece. Hence, the multiplexing part may be integrated within the feedthrough part entirely, namely during the manufacturing process of the antenna assembly. In other words, the multiplexing part and the feedthrough part are together formed as an integrally formed assembly, also called a monolithic or unitary assembly. For instance, the feedthrough part and the multiplexing part are molded or rather casted together in a single manufacturing step, thereby establishing the integrally formed or rather monolithic assembly.

The multiplexing part may comprise an orthomode transducer (OMT). In some embodiments, the multiplexing part is established as an orthomode transducer. The two waveguide inputs are both connected with the multiplexing part such that the signals forwarded by the two waveguide inputs are multiplexed with each other in an orthogonal manner.

Generally, the orthomode transducer is a 3-port waveguide component that is used to separate horizontally polarized signal portions and vertically polarized signal portions from a circularly polarized signal or rather to combine horizontally polarized signals and vertically polarized signals to a circularly polarized signal.

At least one of the two waveguide inputs may be assigned to an internal bent portion, for example by an angle of 90°, such that both waveguide inputs are coplanar. The respective waveguide inputs are located at a common side that can be accessed by the user of the test system easily. Furthermore, the signals processed by the waveguide inputs and forwarded to the multiplexing part can be multiplexed in an orthogonal manner A horizontally polarized signal and a vertically polarized signal may be provided at the respective inputs which are combined to a circular polarized signal.

Another aspect provides that the single waveguide output has a center axis that is inclined with respect to the center axes of the two waveguide inputs and/or the feedthrough part. The center axis of the single waveguide output may coincide with an antenna aperture of an antenna to be connected with the single waveguide output, which corresponds to the direction of the main lobe of the radiation pattern provided by the respective antenna. Since the axes are inclined with respect to each other, the connection of feed lines to the waveguide inputs is independent from an internal arrangement of the antenna. Hence, the overall handling is simplified.

Since the center axis of the single waveguide output is inclined with respect to the feedthrough part, for example a main plane of the feedthrough part, it is ensured that signals emitted by the antenna connected with the antenna assembly can be transmitted towards a reflector located within the test chamber. The inclination angle is different to 0° and 90° with respect to a side wall of the test chamber, for example the adjacent side wall.

According to a further aspect of the disclosure, at least one of the two waveguide inputs and the single waveguide output are orientated in parallel with respect to each other, in particular wherein the respective waveguide input is right-angled. This relates to a specific embodiment in which the center axes of one of the waveguide inputs, for example the right-angled one, and the single waveguide output are coplanar with respect to each other even though they are associated with different sides of the feedthrough part, namely the one associated with an exterior and the one associated with an interior. The waveguide inputs may be located at different planes in this specific embodiment, for example in a perpendicular manner. However, the multiplexing part ensures that the signals provided via the two waveguide inputs are superimposed or rather multiplexed in an orthogonal manner.

Generally, the feedthrough part may comprise a feedthrough plate, wherein the multiplexing part extends through the feedthrough plate such that the multiplexing part has a first portion associated with a first side of the feedthrough plate and a second portion associated with a second side of the feedthrough plate, which is opposite to the first side. In some embodiments, the feedthrough part can be established by the feedthrough plate entirely. Put differently, the feedthrough part may consist of the feedthrough plate. Hence, the multiplexing part is integrated within the feedthrough plate, for example in an inclined manner with regard to a main plane of the feedthrough plate. The feedthrough plate defines the main plane appropriately. The main plane of the feedthrough plate is parallel to the first side and/or the second side of the feedthrough plate which is opposite to the first side.

In general, the multiplexing part extends through the feedthrough plate, wherein the multiplexing part may be located with its center in a plane that corresponds to the center plane of the feedthrough plate. In other words, the center plane encompasses the axis of symmetry of the feedthrough plate. Alternatively, the multiplexing part may extend through the feedthrough plate in a non-symmetric manner, thereby establishing a main portion (concerning the volume) that is associated with the first portion or the second portion. This may inter alia depend on the arrangement of the waveguide inputs at the multiplexing part.

In general, the waveguide inputs are directly connected with the multiplexing part, namely the (integrated) orthomode transducer. Further, the single waveguide output is also directly connected with the multiplexing part, namely the (integrated) orthomode transducer. Thus, the multiplexing part is interconnected between the waveguide inputs and the single waveguide output. Accordingly, the waveguide inputs, the multiplexing part and the single waveguide output together establish a monolithic assembly, namely an integrally formed assembly.

The feedthrough part, namely the feedthrough plate, surrounds the multiplexing part at least partly, thereby including or rather accommodating the multiplexing part in parts.

In any case, the assembly, namely the waveguide inputs, the multiplexing part, the single waveguide output as well as the feedthrough part, may be established by in an integrally formed or rather monolithic manner, thereby providing the interfaces for connecting feed lines as well as the antenna. Simultaneously, the assembly provides the multiplexing functionality as well as the feedthrough functionality.

The single waveguide output may be a circular one or a square one. Thus, the antenna to be connected with the single waveguide output may have a circularly shaped input interface or rather a squared input interface.

Another aspect of the disclosure provides that an antenna is provided that is connected with the single waveguide output. The respective antenna corresponds to the feed antenna that is used for testing the device under test by the test system. The antenna is a circular horn antenna or a square horn antenna. Depending on the respective input interface of the antenna, the single waveguide output may provide a corresponding interface.

Typically, the antenna is provided as a separate part with respect to the assembly that comprises the waveguide inputs, the multiplexing part, the single waveguide output as well as the feedthrough part. Accordingly, the entire antenna assembly that comprises the antenna may be made of two parts, namely the antenna and the integrally formed remainder that comprises waveguide inputs, the multiplexing part, the single waveguide output as well as the feedthrough part.

In addition, at least one internal transition from square waveguides to a circular waveguide or from circular waveguide to square waveguide is provided. This means that the single waveguide output may be assigned to a square output interface whereas the respective antenna has a circular input interface. The intern transition ensures that the respective antenna can be connected with the multiplexing part via the internal transition.

Alternatively, the internal transition may be provided between the multiplexing part and the single waveguide output, thereby transforming the respective shape between the multiplexing part and the single waveguide output. The internal transition may relate to an integrated one.

Furthermore, embodiments of the present disclosure also provide a test system for testing a device under test. In an embodiment, the test system comprises a test chamber with an opening and the antenna assembly described above. The feedthrough part of the antenna assembly is located in the area of the opening such that the opening is sealed by the feedthrough part, for example wherein the feedthrough part provides a portion of the wall of the test chamber. Therefore, separately formed feedthrough means are not necessary since the antenna assembly itself provides the feedthrough part that is used for forwarding test signals from an exterior into the test chamber that can be used for testing the device under test in appropriate manner. The test chamber has an opening that is used for receiving the antenna assembly, for example its feedthrough part. In a mounted state of the test system, the opening is sealed by the feedthrough part of the antenna assembly. Further, the antenna assembly is connected with the test chamber in the mounted state via a connecting interface of the test chamber.

An aspect of the disclosure provides that a reflector is located within the test chamber via which a signal path is established between an antenna connected with the single waveguide output of the antenna assembly and a test location for device under test. A quiet zone is established at the test location, which is used for testing the device under test under defined conditions. Typically, the antenna is placed at the focal point of the respective reflector at a specific angle that is used for testing the device under test.

Moreover, embodiments of the present disclosure provide a method of establishing a test system for testing a device under test. In an embodiment, the method comprises the following steps:

providing an antenna assembly as described above, connecting the antenna assembly via its feedthrough part with a connecting interface of a test chamber, and connecting an antenna with the single waveguide output of the antenna assembly.

Accordingly, the test system is established that can be used for testing the device under test. The test system corresponds to a compact antenna test range (CATR) that is used for testing the device under test over-the-air (OTA). The antenna assembly having the feedthrough part ensures that the test chamber is sealed by blocking and therefore sealing the opening within the test chamber.

In some embodiments, the feedthrough part may be connected to the connecting interface mechanically, for example via bolts and/or screws. The mechanical connection may be done via the outer surface of the test chamber such that the mechanical connection may be established in an easy manner since the external sides of the test chamber can be accessed easily by a user of the test system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
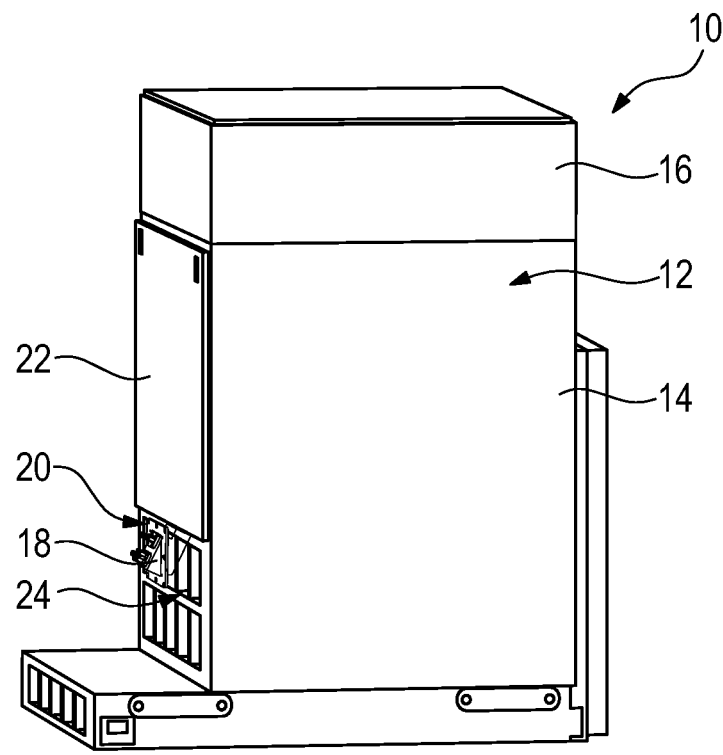
FIG. 1 shows a test system according to an embodiment of the present disclosure.

In FIG. 1, a test system 10 is shown that comprises a test chamber 12 that is encompassed by a housing 14 and a lid 16 which together delimit a space of the test chamber 12. The test system 10 further comprises an antenna assembly 18 that is connected with a connecting interface 20 of the test chamber 12. The connecting interface 20 is located at a wall 22 of the test chamber 12, which is part of the housing 14, for example a side wall.

In the wall 22, an opening 24 is provided that is located next to the connecting interface 20 via which the antenna assembly 18 is connected with the test chamber 12 in a mechanical manner. In other words, the test chamber 12 has an opening 24 that is sealed by the antenna assembly 18 in the mounted state of the test system 10 that is shown in FIG. 1.

Figure 2:
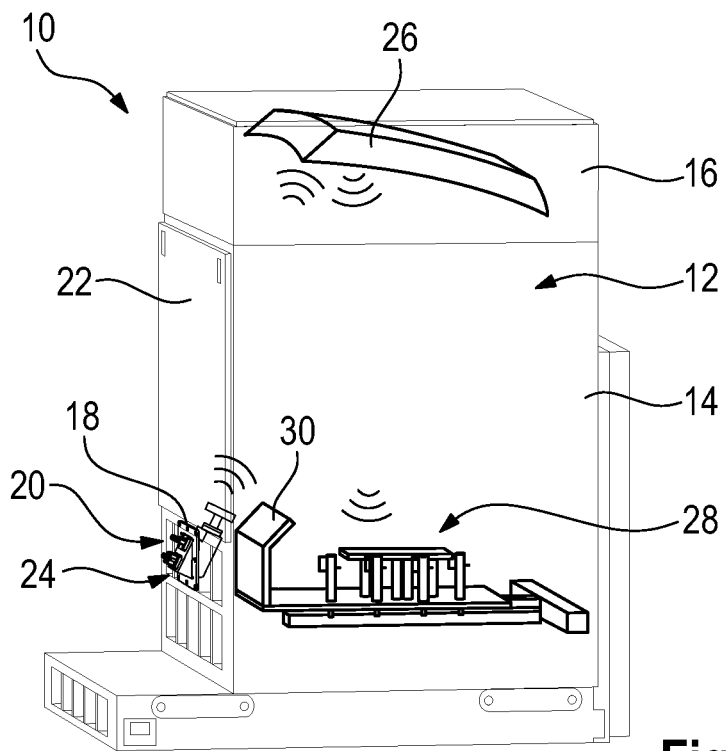
FIG. 2 shows the test system of FIG. 1 in a partially transparent manner.

In FIG. 2, the test system 10 of FIG. 1 is shown in a partially transparent manner since the housing 14 and the lid 16 are illustrated partially transparent, thereby providing an insight into the test chamber 12. As shown in FIG. 2, a reflector 26 as well as a test location 28 are provided within the test chamber 12, which are encompassed via the housing 14 and the lid 16. In some embodiments, the reflector 26 is connected with the lid 16 such that the reflector 26 is orientated in a defined manner when the lid 16 is placed on the housing 14, namely in the mounted state of the test system 10.

Generally, a signal path is established between the antenna assembly 18 and the test location 28 via the reflector 26, wherein the antenna assembly 18 is located in the focal point of the reflector 26. The respective signal path is illustrated by the respective symbols in FIG. 2.

In addition, a shielding member 30 is provided that is located between the antenna assembly 18 and the test location 28. Hence, the shielding member 30 ensures that a device under test located at the test location 28 only receives signals from a dedicated direction, namely via the reflector 26.

Figure 3:
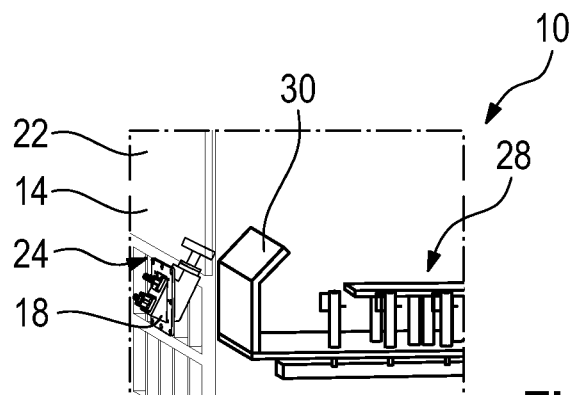
FIG. 3 shows a detail of FIG. 2.

In FIG. 3, the antenna assembly 18, the shielding member 30 as well as the test location 28 are shown in more detail. The shielding member 30 is located in a direct way between the antenna assembly 18 and the test location 28.

Figure 4:
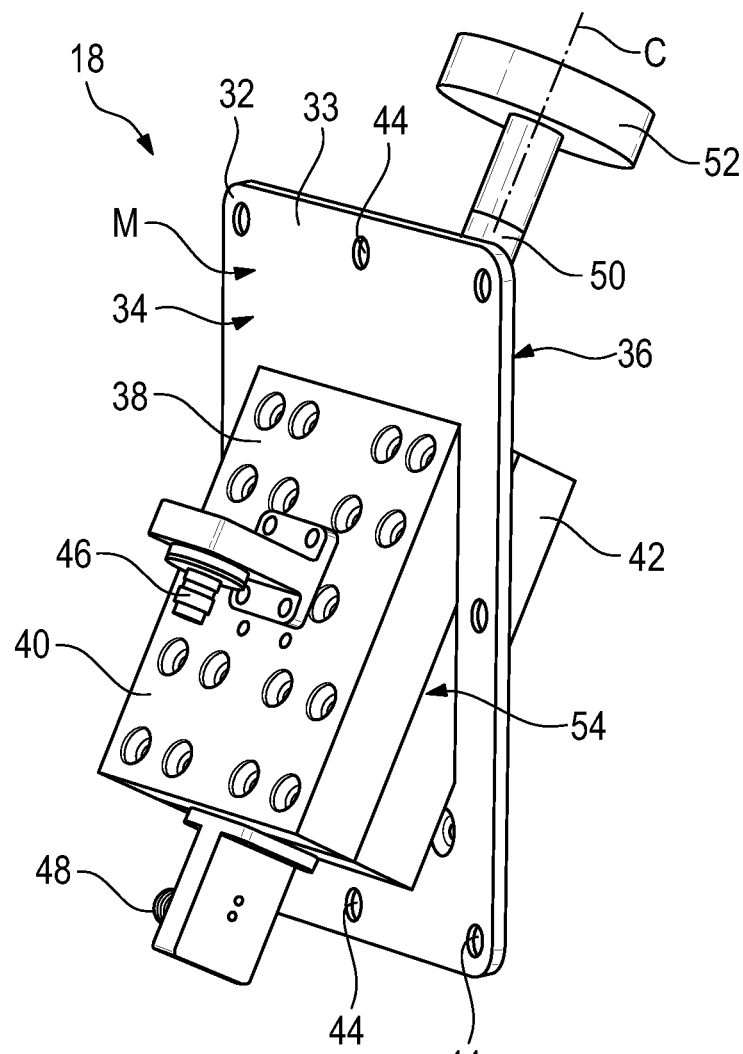
FIG. 4 shows an antenna assembly according to a first embodiment of the present disclosure.

The antenna assembly 18 according to a first embodiment is shown in FIG. 4 in more detail. As shown in FIG. 4, the antenna assembly 18 comprises a feedthrough part 32 that is established by a feedthrough plate 33 having a first side 34 as well a second side 36 opposite to the first side 34. The antenna assembly 18 also has a multiplexing part 38 that is partially integrated within the feedthrough part 32 as shown in FIG. 4, for example within the feedthrough plate 33.

Hence, the multiplexing part 38 has a first portion 40 that is associated with the first side 34 of the feedthrough part 32, for example the feedthrough plate 33. Further, the multiplexing part 38 has a second portion 42 that is associated with the second side 36 of the feedthrough part 32, for example the feedthrough plate 33. In other words, the multiplexing part 38 extends through the feedthrough part 32, namely the feedthrough plate 33, as illustrated in FIG. 4.

As shown in FIGS. 1, 2, 3, the antenna assembly 18 is connected with the test chamber 12, for example the housing 14 having the opening 24, via its feedthrough part 32.

In some embodiments, the mechanical connection is established via the feedthrough plate 33 that has several holes 44 through which screws and/or bolts may extend in order to interact with holes provided in the test chamber 12, for example the housing 14, within the connecting interface 20.

Accordingly, the antenna assembly 18 can be connected to the test chamber 12 via the feedthrough part 32, for example the feedthrough plate 33, which blocks and seals the opening 24 provided in the housing 14 accordingly.

The antenna assembly 18 generally ensures that signals can be provided from the exterior, for instance an externally located signal generator, that are used within the test chamber 12 for testing the device under test that is located on the testing location 28.

For this purpose, the antenna assembly 18 has at least two waveguide inputs 46, 48 that are associated with the first portion 40 of the multiplexing part 38. Hence, the waveguide inputs 46, 48 are associated with the exterior such that they can be accessed by the user in the mounted state easily. In addition, the antenna assembly 18 has a single waveguide output 50 that is associated with the second portion 42 of the multiplexing part 38, which faces the interior of the test chamber 12.

In the mounted state of the antenna assembly 18 at the test chamber 12, the waveguide inputs 46, 48 are located externally, whereas the single waveguide output 50 is located within the test chamber 12. In the shown embodiment, the first waveguide input 46 is orientated in parallel with the single waveguide output 50. The waveguide inputs 46, 48 are orientated in a perpendicular manner with respect to each other. Moreover, an antenna 52 is connected with the single waveguide output 50 of the antenna assembly 18.

In the shown embodiment, the waveguide inputs 46, 48 are right-angled ones since they project from a side of the multiplexing part 38 which faces towards the exterior in a substantially perpendicular manner, namely in a right angle.

The waveguide inputs 46, 48 can be used in combination with the multiplexing part 38 such that horizontally polarized signals as well as vertically polarized signals are multiplexed by the multiplexing part 38 in order to generate a circularly polarized signal that is outputted via the single waveguide output 50 and the antenna 52 connected thereto.

Accordingly, the multiplexing part 38 may comprise an orthomode transducer 54. In some embodiments, the multiplexing part 38 is established by or is composed of the orthomode transducer 54 since orthogonally polarized signals, namely orthogonal modes, can be combined by the orthomode transducer 54.

The waveguide inputs 46, 48 are directly connected with the multiplexing part 38, which in turn is directly connected with the single waveguide output 50. Hence, the respective components are formed in an integral or rather monolithic manner.

In addition, the multiplexing part 38 is integrated within the feedthrough part 32, for example the feedthrough plate 33, such that no gaps are provided between the multiplexing part 38 and the feedthrough part 32. For instance, the multiplexing part 38 and the feedthrough part 32 are formed in one piece, namely by the same material within a single manufacturing step. Hence, the assembly that comprises the waveguide inputs 46, 48, the multiplexing part 38, the single waveguide output 50 as well as the feedthrough part 32 are integrally formed or rather manufactured in a monolithic manner.

Alternatively, the multiplexing part 38 and the feedthrough part 32 may be connected with each other by welding. Hence, two separate parts may be provided that are connected with each other afterwards, thereby establishing the respective assembly.

Figure 5:
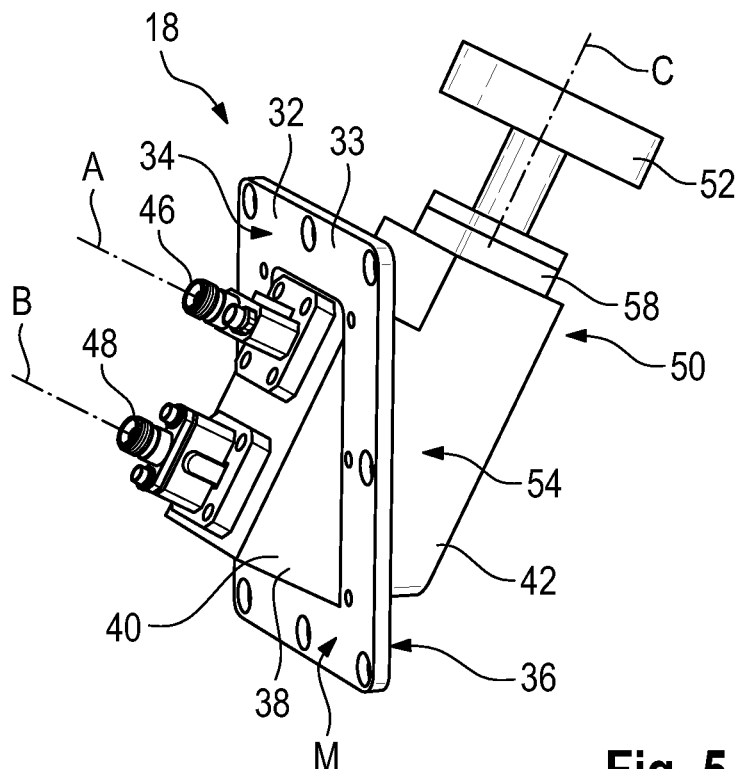
FIG. 5 shows an antenna assembly according to a second embodiment of the present disclosure.
Figure 6:
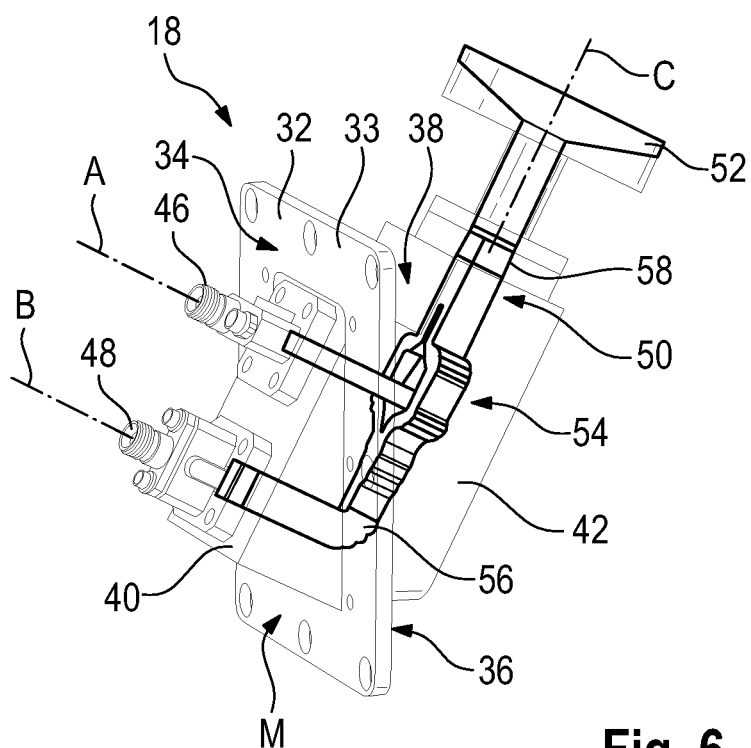
FIG. 6 shows the antenna assembly of FIG. 5 in a partially transparent manner.

In FIGS. 5 and 6, a second embodiment of the antenna assembly 18 is shown that distinguishes from the one shown in FIG. 4 in that the waveguide inputs 46, 48 are coplanar. Hence, the waveguide inputs 46, 48 are located at a common side of the multiplexing part 38 that is associated with the first side 34 of the feedthrough part 32.

Thus, the single waveguide output 50 has a center axis C that is inclined with respect to the center axes A, B of the waveguide inputs 46, 48, for example by a right angle. In addition, the center axis C of the single waveguide output 50 is also inclined with respect to a main plane M of the feedthrough part 32, for example the feedthrough plate 33, wherein the main plane M is parallel to the first side 34 or rather the second side 36. This is also shown in the embodiment of FIG. 4.

In FIG. 6, a partially transparent illustration is provided that shows the signal paths associated with the waveguide inputs 46, 48, the orthomode transducer 54 as well as the single waveguide output 50. Moreover, FIG. 6 shows that an internal bent portion 56 is provided which has an angle of 90°. The internal bent portion 56 is interconnected between one of the waveguide inputs 46, 48 and the orthomode transducer 54. Furthermore, an internal transition 58 is installed that generally provides a transition from a square waveguide to a circular waveguide or vice versa.

In the shown embodiment, the internal transition 58 is located between the single waveguide output 50 having a square waveguide interface and the antenna 52 having a circular waveguide interface. Accordingly, the internal transition 58 ensures that the antenna 52 can be connected with the single waveguide output 50 even though differently shaped waveguide interfaces are provided.

The internal transition 58 is an optional component that depends on the respective interface of the antenna 52 used for being connected with the single waveguide output 50. Of course, the internal transition 58 may also be a transition from a circular waveguide to a square waveguide provided that the single waveguide output 50 has a circular interface, whereas the antenna 52 has a square interface. Moreover, the internal transition 58 may be located between the orthomode transducer 54 and the single waveguide output 50 in order to provide a transition between these components. Then, the internal transition 58 may relate to an integrated one.

Accordingly, the internal transition 58 corresponds, for example, to an adapter that is used to adapt the respective kind of interfaces.

In general, the multiplexing part 38 may be integrated within the feedthrough part 32 such that the multiplexing part 38 and the feedthrough part 32 are formed in one piece or rather in a monolithic or unitary manner. For instance, a certain structure may be milled, thereby establishing the integration of the multiplexing part 38 within the feedthrough part 32.

Alternatively, two separate parts are provided that are welded together in order to establish the partly integration. However, no gaps occur between the multiplexing part 38 and the feedthrough part 32, thereby ensuring that the overall size is reduced accordingly.

The antenna assembly 18 ensures low path loss due to the integration of the multiplexing part 38 into the feedthrough part 32. Furthermore, the entire test system 10 is less complex since the antenna assembly 18 provides several functions in a combined manner. In addition, an easy feed switching, namely a manual one, is ensured by the antenna assembly 18 since two waveguide inputs 46, 48 are provided at an external side of the antenna assembly 18 in its mounted state. Accordingly, the two waveguide inputs 46, 48 are associated with a side of the feedthrough part 32 that can be accessed from the exterior when the antenna assembly 18 is installed, namely connected with the test chamber 12.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An antenna assembly for a test system, comprising:
    a feedthrough part that provides an interface for interconnecting a feed antenna of the test system with respective cables or lines that provide test signals;
    two waveguide inputs;
    a single waveguide output; and
    a multiplexing part that is interconnected between the two waveguide inputs and the single waveguide output, wherein the multiplexing part comprises an orthomode transducer, and wherein the multiplexing part is integrated within the feedthrough part at least partially.

2. The antenna assembly according to claim 1, wherein the multiplexing part is integrated within the feedthrough part by at least one of milling and welding.

3. The antenna assembly according to claim 1, wherein the multiplexing part and the feedthrough part are formed in one piece.

4. The antenna assembly according to claim 1, wherein at least one of the two waveguide inputs is assigned to an internal bent portion such that both waveguide inputs are coplanar.

5. The antenna assembly according to claim 1, wherein at least one of the two waveguide inputs is assigned to an internal bent portion by an angle of 90° such that both waveguide inputs are coplanar.

6. The antenna assembly according to claim 1, wherein the single waveguide output has a center axis that is inclined with respect to the center axes of the two waveguide inputs and/or the feedthrough part.

7. The antenna assembly according to claim 1, wherein the single waveguide output and at least one of the two waveguide inputs are orientated in parallel with respect to each other.

8. The antenna assembly according to claim 7, wherein the respective waveguide input is right-angled.

9. The antenna assembly according to claim 1, wherein the feedthrough part comprises a feedthrough plate, wherein the multiplexing part extends through the feedthrough plate such that the multiplexing part has a first portion associated with a first side of the feedthrough plate and a second portion associated with a second side of the feedthrough plate, which is opposite to the first side.

10. The antenna assembly according to claim 1, wherein the single waveguide output is circular or square.

11. The antenna assembly according to claim 1, wherein an antenna is provided that is connected with the single waveguide output.

12. The antenna assembly according to claim 11, wherein the antenna is a circular horn antenna or a square horn antenna.

13. The antenna assembly according to claim 1, wherein at least one internal transition from square waveguide to circular waveguide or from circular waveguide to square waveguide is provided.

14. The antenna assembly according to claim 13, wherein the at least one internal transition is provided by the multiplexing part.

15. A test system for testing a device under test, wherein the test system comprises a test chamber with an opening and the antenna assembly according to claim 1, wherein the feedthrough part of the antenna assembly is located in the area of the opening such that the opening is sealed by the feedthrough part and provides a portion of the wall of the test chamber.

16. The test system according to claim 15, wherein a reflector is located within the test chamber via which a signal path is established between an antenna connected with the single waveguide output of the antenna assembly and a test location for a device under test.

17. A method of establishing a test system for testing a device under test, wherein the method comprises:
    providing an antenna assembly according to claim 1;
    connecting the antenna assembly via said feedthrough part with a connecting interface of a test chamber; and connecting an antenna with the single waveguide output of the antenna assembly.

18. The method according to claim 17, wherein the feedthrough part is mechanically connected to the connecting interface.

19. The method according to claim 17, wherein the feedthrough part is connected to the connecting interface via at least one of bolts and screws.

\* \* \* \* \*